United States Patent
Naji

(10) Patent No.: US 6,385,109 B1
(45) Date of Patent: May 7, 2002

(54) REFERENCE VOLTAGE GENERATOR FOR MRAM AND METHOD

(75) Inventor: Peter K. Naji, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/772,668

(22) Filed: Jan. 30, 2001

(51) Int. Cl.[7] ............................................. G11C 11/00
(52) U.S. Cl. .................. 365/209; 365/210; 365/225.5; 365/189.09; 365/158; 365/129; 365/171; 365/173
(58) Field of Search ................................ 365/209, 210, 365/173, 225.5, 158, 189.09, 129, 171

(56) References Cited

U.S. PATENT DOCUMENTS

| | | | | |
|---|---|---|---|---|
| 5,384,740 A | * | 1/1995 | Etoh et al. ............. | 365/189.09 |
| 5,530,397 A | * | 6/1996 | Nakai et al. ................. | 327/545 |
| 5,828,604 A | * | 10/1998 | Kawai et al. ........... | 365/185.22 |
| 6,008,674 A | * | 12/1999 | Wada et al. .................. | 327/89 |
| 6,341,084 B2 | * | 1/2002 | Numata et al. ............. | 365/158 |

* cited by examiner

Primary Examiner—Viet Q. Nguyen
(74) Attorney, Agent, or Firm—William E. Koch

(57) ABSTRACT

Readout circuitry for a magnetic tunneling junction (MTJ) memory cell, or an array of MTJ memory cells, is disclosed which requires a varying reference voltage equal to $(V_{bias1}/2)(1+R_{min}/R_{max})$ where $V_{bias1}$ is a clamping voltage applied to the readout circuitry, $R_{min}$ is a minimum resistance of the magnetic tunneling junction memory cell, and $R_{max}$ is a maximum resistance of the magnetic tunneling junction memory cell. A reference voltage generator is disclosed which generates the reference voltage and includes an operational amplifier and two MTJ memory cells connected to provide an output signal equal to $(V_{bias1}/2)(1+R_{min}/R_{max})$

3 Claims, 2 Drawing Sheets

REFERENCE VOLTAGE GENERATOR FOR MRAM AND METHOD

FIELD OF THE INVENTION

This invention relates to apparatus for reading data stored in Magnetic Tunneling Junction (MTJ) cells in Magnetoresistive Random Access Memories (MRAMs) and more specifically to reference voltage generators in the apparatus for reading data.

BACKGROUND OF THE INVENTION

Thin film Magnetic Random Access Memories (MRAMs) can be fabricated in a variety of memory cell embodiments, including a Magnetic Tunneling Junction (MTJ) cell. The MTJ cell essentially consists of a pair of magnetic layers with an insulating layer sandwiched therebetween. One of the magnetic layers has a fixed magnetic vector and the other magnetic layer has a changeable magnetic vector that is either aligned with or opposed to the fixed magnetic vector. When the magnetic vectors are aligned the resistance of the MTJ cell, i.e. the resistance to current flow between the magnetic layers, is a minimum and when the magnetic vectors are opposed or misaligned the resistance of the MTJ cell is a maximum.

Data is stored in the MTJ cell by applying a magnetic field to the MTJ cell directed so as to move the changeable magnetic vector to a selected orientation. Generally, the aligned orientation can be designated a logic 1 or 0 and the misaligned orientation is the opposite, i.e., a logic 0 or 1. Stored data is read or sensed by passing a current through the MTJ cell from one magnetic layer to the other. The amount of current passing through the MTJ cell, or the voltage drop across the MTJ cell, will vary according to the orientation of the changeable magnetic vector. Additional information as to the fabrication and operation of MTJ memory cells can be found in U.S. Pat. No. 5,702,831, entitled "Multi-Layer Magnetic Tunneling Junction Memory Cells", issued Mar. 31, 1998, and incorporated herein by reference.

In the prior art, reading data stored in MTJ cells is achieved by passing a current through a series circuit including a load resistor and the MTJ cell. The current passing through the MTJ cell is controlled by a transistor with a bias voltage on the gate, and an output voltage is obtained at a junction between the load resistor and the current controlling transistor. Also, a bitline and a data line for the MTJ cell (and other MTJ cells in the array) are clamped at a desired voltage by the transistor. There are several major problems with this type of data readout including the fact that the load resistor must be much larger than the resistance of the MTJ cell, which makes operation at low supply voltages very difficult. Also, the operation of the circuit is dependent upon the clamping voltage provided by the transistor and the bias voltage. However, the clamping voltage is a function of the resistance of the MTJ cell, the bias voltage, and the load resistance, any or all of which can vary with a specific readout process, variations in the supply voltage, changes in temperature, changes in the resistance of the MTJ cell, etc. Also, the large load resistance and the other components in this prior art circuit require large chip areas preventing the fabrication of high density memory arrays. Also, the input impedance is high due to the presence of the load resistor.

Accordingly it is highly desirable to provide improved apparatus for reading data stored in Magnetic Tunneling Junction (MTJ) cells in Magnetoresistive Random Access Memories (MRAMs) and more specifically to provide improved reference voltage generators in the apparatus for reading data.

BRIEF DESCRIPTION OF THE DRAWINGS

Referring to the drawings.

DESCRIPTION OF THE PREFERRED EMBODIMENT

A current conveyor for readout of a magnetic tunneling junction memory cell is disclosed in a copending U.S. patent application entitled "Current Conveyor and Method For Readout of MTJ Memories", Ser. No. 09/540,794, filed Mar. 31, 2000, assigned to the same assignee, and incorporated herein by reference. The current conveyor described in this copending patent application uses a reference voltage ($V_{biasref}$), which is the subject of this disclosure.

Figure 1:
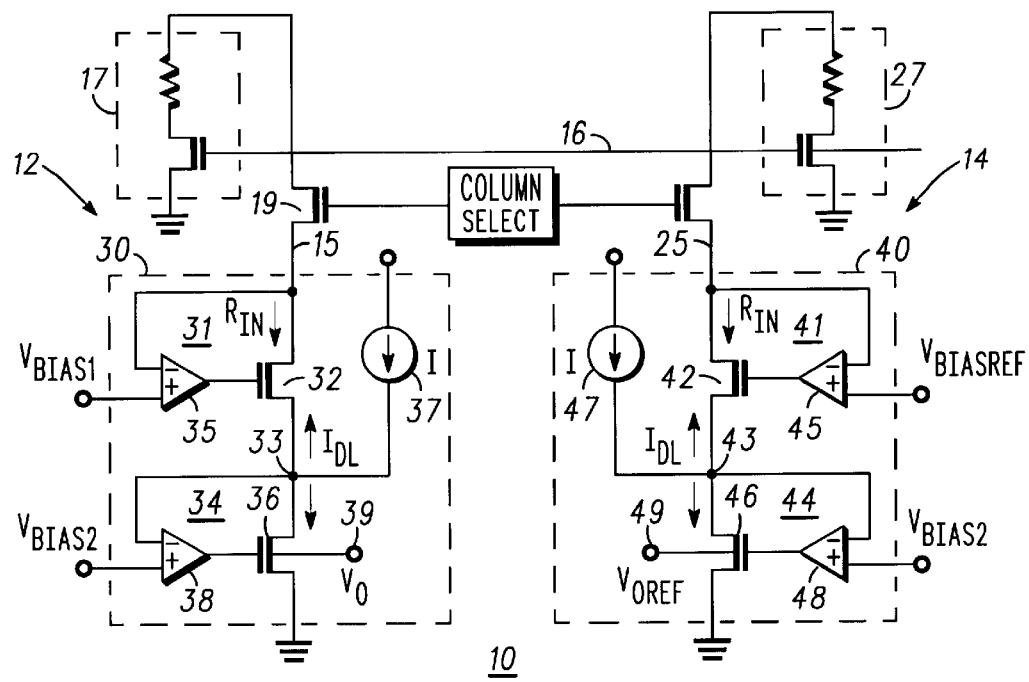
FIG. 1 is a simplified schematic diagram of an MTJ memory cell (representing a column of MTJ memory cells), a reference cell (representing a reference column) and readout circuitry.

Generally, a Magnetoresistive Random Access Memory (MRAM) includes an array of Magnetic Tunneling Junction (MTJ) memory cells arranged in rows and columns, as illustrated in the above described copending application. Referring to FIG. 1, a simplified representation of an MRAM array and readout structure 10 is illustrated, wherein a single column 12 of memory cells and a single column 14 of reference cells is depicted. In column 12, a data readout line, which in this embodiment is designated dataline 15, connects a column of MTJ memory cells together in a well known fashion. Rows of MTJ memory cells are connected together by means of a wordline 16. In this description only one MTJ memory cell 17 is included in column 12 for simplicity and the MTJ in the single memory cell is illustrated as a resistance designated Rmtj. MTJ memory cell 17 is connected through a column decode transistor 19 to a dual current conveyor designated 30.

Reference column 14 of the array is represented by a single reference MTJ memory cell 27. A data readout line, which in this embodiment is designated dataline 25, connects a column of reference MTJ memory cells together in a fashion similar to that described above. Each reference MTJ memory cell 27 in column 14 is connected into the rows of MTJ memory cells 17 in array 10 by means of wordlines 16 (only one illustrated). In this description only one reference MTJ memory cell 27 is included for simplicity and the MTJ in the single reference memory cell is illustrated as a resistance designated $Rmtj_{ref}$. Reference MTJ memory cell 27 is connected through a column decode transistor 29 to a dual current conveyor designated 40.

Dual current conveyor 30 includes a transistor 32 (which may be, for example, a field effect transistor, an HFET, a thin film transistor, or the like) having one current terminal (e.g. the source or drain) connected to dataline 15 and the other current terminal (e.g. the drain or source) connected to a junction 33. Junction 33 is also connected to a current source 37. The control terminal or gate of transistor 32 is connected to the output terminal of an operational amplifier 35. Transistor 32 and operational amplifier 35 generally form a first current conveyor 31 of dual current conveyor 30. A negative input terminal of operational amplifier 35 is connected to receive negative feedback from dataline 15 and a positive input terminal is connected to have a bias voltage $V_{bias1}$ supplied thereto. It should be noted that the negative input terminal of operational amplifier 35 has a very high (substantially infinite) input impedance so that little or no current flows from dataline 15.

A second transistor 36 is coupled between junction 33 and a common potential, such as ground. The control terminal or gate of transistor 36 is connected to the output terminal of an operational amplifier 38. Transistor 36 and operational amplifier 38 generally form a second current conveyor 34 of dual current conveyor 30. A negative input terminal of operational amplifier 38 is connected to receive negative feedback from junction 33 and a positive input terminal is connected to have a bias voltage $V_{bias2}$ supplied thereto. As discussed above, the negative input terminal of operational amplifier 38 has a very high (substantially infinite) input impedance so that little or no current flows from junction 33. An output signal $V_o$ is available at a terminal 39 coupled to the gate of transistor 36.

In the operation of first current conveyor 31, operational amplifier 35 compares the voltage $V_{d1}$ on dataline 15 to $V_{bias1}$ and by means of the negative feedback clamps $V_{d1}$ to $V_{bias1}$ (since operational amplifier 35 looks essentially like a virtual short circuit between $V_{d1}$ and $V_{bias1}$), essentially providing current mode operation. First current conveyor 31 has a very low input impedance, isolating dataline 15 from the high output impedance of current source 37. Also, first current conveyor 31 isolates dataline 15 from the high impedance of transistor 36, which provides a highly sensitive and high impedance at junction 33. Second current conveyor 34 operates as a secondary clamp circuit and is responsible for sensing the same MTJ memory cell 17 current changes and providing output $V_o$ at output terminal 39. Second current conveyor 34 clamps junction 33 to a predetermined voltage such that transistor 36, current source 37, and transistor 32 are maintained and kept in deep saturation under all process, supply, and temperature conditions, plus all variations of MTJ memory cell 17 within the linearity limits of operational amplifier 38.

Dual current conveyor 30 has a very low input impedance and a very high output impedance. The low input impedance combined with the clamping of $V_{d1}$ limits the voltage swing of dataline 15 and achieves high speed readout for very high density MTJ arrays. Thus, dual current conveyor 30 provides and maintains a constant bias across MTJ memory cell 17 regardless of operating temperatures, changes in the supply voltage, and process conditions. Also, dual current conveyor 30 provides a small swing in the voltage on dataline 15 to allow for high speed operation. Here it should be understood that the term "operational amplifier" is a generic term for any circuit which will provide the described operation and is not limited to any specific circuit. Additional information and different embodiments can be found in the above identified copending patent application.

In the circuitry of FIG. 1, dual current conveyor 40 operates in a fashion similar to dual current conveyor 30 and provides a $Vo_{ref}$ output signal at an output terminal 49. Dual current conveyor 40 includes a first current conveyor 41 and a second current conveyor 44. A transistor 42 and an operational amplifier 45 generally form first current conveyor 41. A negative input terminal of operational amplifier 45 is connected to receive negative feedback from dataline 25 and a positive input terminal is connected to have a bias voltage $V_{biasref}$ supplied thereto. A second transistor 46 is coupled between a junction 43 and a common potential, such as ground. The control terminal or gate of transistor 46 is connected to the output terminal of an operational amplifier 48. Transistor 46 and operational amplifier 48 generally form second current conveyor 44 of dual current conveyor 40. A negative input terminal of operational amplifier 48 is connected to receive negative feedback from junction 43 and a positive input terminal is connected to have a bias voltage $V_{bias2}$ supplied thereto.

Generally, a differential readout circuit incorporating dual current conveyors 30 and 40 is connected in a differential fashion. In the differential readout circuit (illustrated in the above identified patent application), reference output voltage $Vo_{ref}$ and data output voltage $Vo$ are connected to separate inputs of a differential amplifier, which provides an output signal $Vo-Vo_{ref}$. As explained in detail in the above identified patent application, a major advantage of the differential readout circuit is that it provides an offset-free output $Vo-Vo_{ref}$. The output signal $Vo-Vo_{ref}$ from the differential amplifier is independent of the voltage across the drain-source of transistors 36 and 46, which means that the output signal $Vo-Vo_{ref}$ is not affected by offset voltages in the operational amplifiers in current conveyors 34 and 44 as long as transistors 36 and 46 are in saturation.

Here it should be noted that Vo varies between $Vo_{max}$ and $Vo_{min}$, where $Vo_{max}$ is the output of current conveyor 30 when Rmtj is a maximum resistance $R_{max}$ and $Vo_{min}$ is the output of current conveyor 30 when Rmtj is a minimum resistance $R_{min}$. Since $Vo_{ref}$ is subtracted from Vo, the value of $Vo_{ref}$ must be between $Vo_{max}$ and $Vo_{min}$. The value of $Vo_{ref}$ is determined by the value of $V_{biasref}$. To place $Vo_{ref}$ between $Vo_{max}$ and $Vo_{min}$, the value of $V_{biasref}$ must be adjusted properly. It has been found that a reference voltage generator can be provided which generates a reference voltage ($V_{biasref}$) that is capable of tracking both $R_{min}$ and MR, where MR is the ratio between the maximum resistance and the minimum resistance as stated in the relationship ($R_{max}-R_{min})/R_{min}$.

Figure 2:
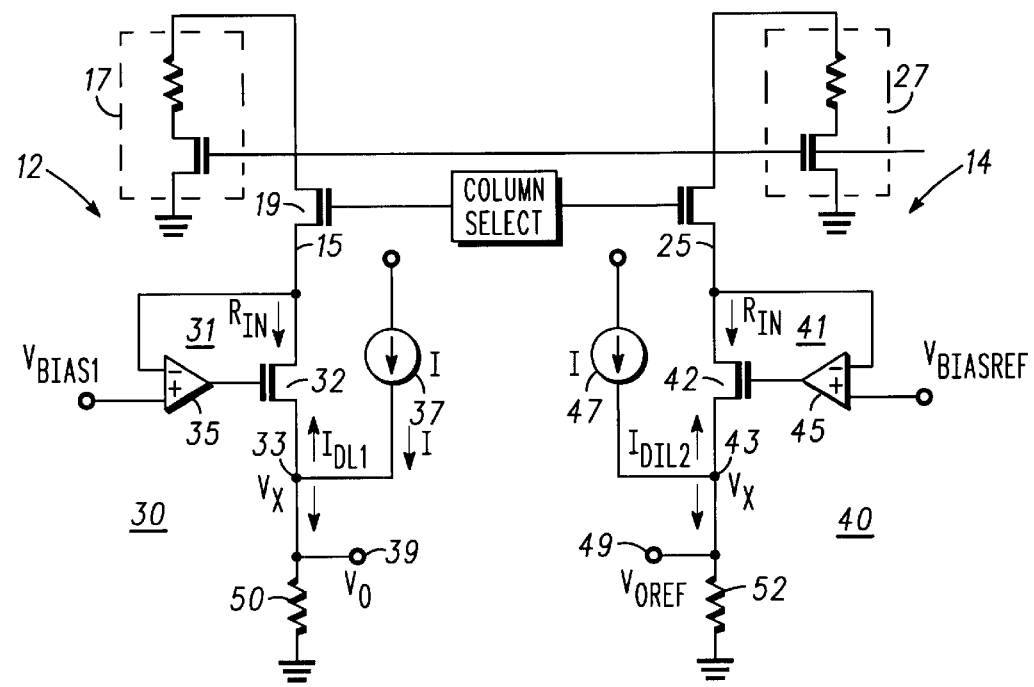
FIG. 2 is the schematic diagram of FIG. 1 with some simplifications included for purposes of explanation.

Referring additionally to FIG. 2, the circuitry of FIG. 1 has been further simplified, with similar components being designated with similar numbers. Since, transistor 36 and operational amplifier 38 act as a linear voltage controlled resistor, they can be represented or replaced by a resistor 50 and the output Vo taken at junction 33. Similarly, since transistor 46 and operational amplifier 48 act as a linear voltage controlled resistor, they can be represented or replaced by a resistor 52 and the output $Vo_{ref}$ taken at junction 43. Further, the positive input terminal of operational amplifier 45 is connected to have the reference voltage $V_{biasref}$ supplied thereto from a voltage reference generator.

With the above simplifications incorporated in the circuitry, the following equations can be easily generated.

$$Vo_{min} = (I - V_{bias1}/R_{min})R_{50}$$

$$Vo_{max} = (I - V_{bias1}/R_{max})R_{50}$$

Also, it is preferred that $Vo_{ref}$ be held approximately half way between $Vo_{max}$ and $Vo_{min}$, so that the following relationship is true.

$$Vo_{ref} = (Vo_{max} - Vo_{min})/2 + Vo_{min}$$

Substituting the first two equations or definitions into the third equation results in:

$$Vo_{ref} = R_{50}\{I - (V_{bias1}/2)(1/R_{min} + 1/R_{max})\}$$

Since $R_{50} = R_{52}$, the above equation can be rewritten as:

$$Vo_{ref} = R_{52}\{I - (V_{bias1}/2)(1/R_{min} + 1/R_{max})\}$$

Vo$_{ref}$ now is expressed as the output voltage of conveyor 40, and in further examination is shifted to current conveyor 40.

It can be seen that the current I flowing from current source 47 into junction 43 splits with a portion (herein designated I$_{d/2}$) of the total current flowing through dataline 25 and MTJ cell 27 and the remainder of the current (I–I$_{d/2}$) flowing through R$_{52}$. Thus, I$_{d/2}$ is defined as:

$$I_{dl2}=(V_{bias1}/2)(1/R_{min}+1/R_{max})$$

Referring to the reference portion of the circuit of FIG. 2, it should be noted that reference MTJ cell 27 is not programmable but is in fact always set to R$_{min}$. Further, in the preferred embodiment, all of the memory cells of array 10 are fabricated on a common substrate and using common techniques so that MTJ cell 27 and all of the components in the reference column 14 are substantially similar to MTJ cell 17 and all of the components in column 12. Also, as explained above, in the operation of first current conveyor 41, operational amplifier 45 compares the voltage on dataline 25 to V$_{biasref}$ and by means of the negative feedback, clamps the dataline voltage to V$_{biasref}$ (since operational amplifier 45 looks essentially like a short circuit between the dataline and V$_{biasref}$). Therefore, the following equation is true:

$$I_{dl2}=V_{biasref}/R_{min}$$

Combining the last two equations gives the relationship:

$$V_{biasref}/R_{min}=(V_{bias1}/2)(1/R_{min}+1/R_{max}$$

Simplifying this equation results in the following definition for V$_{biasref}$:

$$V_{biasref}=(V_{bias1}/2)(1+R_{min}/R_{max})$$

This equation shows that V$_{biasref}$ is a function of V$_{bias1}$, R$_{min}$, and, R$_{max}$, which means that V$_{biasref}$ will get adjusted based on R$_{min}$, and MR, as well as V$_{bias1}$, which is the clamping voltage applied to the data columns (e.g., column 12). V$_{bias1}$, R$_{min}$, and, R$_{max}$ are the dependent variables which are used for properly adjusting V$_{biasref}$. Further, it will be seen that the above equation defining V$_{biasref}$ can be easily implemented with a non-inverting operational amplifier.

Figure 3:
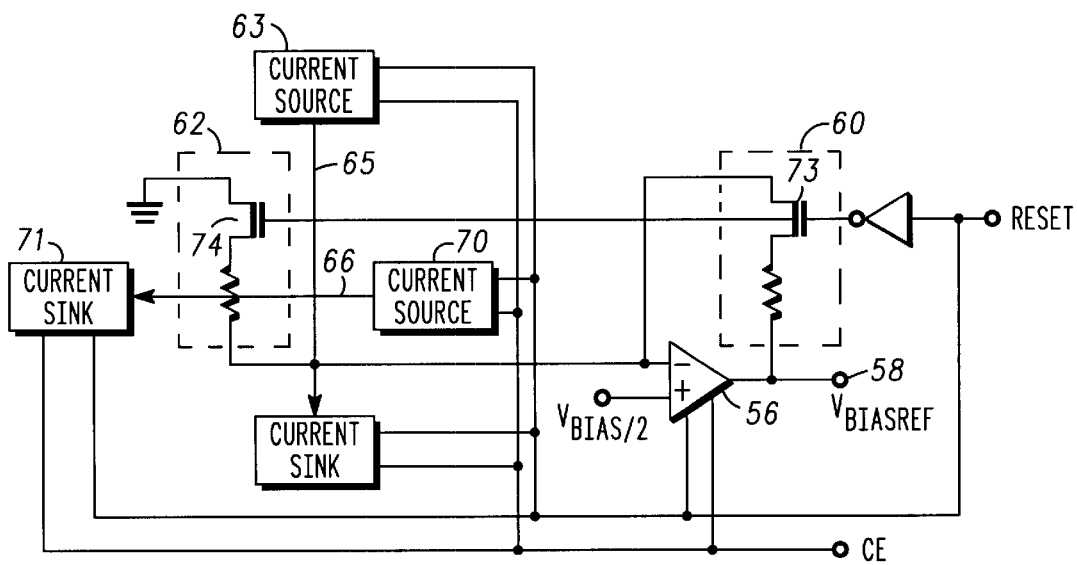
FIG. 3 is a schematic diagram of a reference voltage generator in accordance with the present invention.

Turning now to FIG. 3, a schematic diagram is illustrated of a reference voltage generator 55 in accordance with the present invention. Generator 55 includes a non-inverting operational amplifier 56 having a first control terminal coupled to CE (a chip enable line) and a second control terminal coupled to Res (a chip reset line). When CE goes high operational amplifier 56 is enabled and when Res goes high operational amplifier 56 is disabled. Operational amplifier 56 has an output terminal 58 which is connected to the V$_{biasref}$ of operational amplifier 45 in FIG. 2. A positive input terminal of operational amplifier 56 is connected to receive a voltage equal to one half of the bias or clamping voltage applied to the positive terminal of operational amplifier 35 in FIG. 2. Since the bias or clamping voltage is simply a DC source (as explained in the above identified patent application), providing a potential one half the value is well within the expertise of those skilled in the art.

An MTJ memory cell 60 is connected in a feedback path between the output terminal 58 of operational amplifier 56 and a negative input terminal. MTJ memory cell 60 is always set to R$_{min}$ (i.e., it is not programmable). Another MTJ memory cell 62 is connected between a common or ground and the negative input terminal of operational amplifier 56. A bitline 65 and a digitline 66 are magnetically associated with MTJ memory cell 62 to program it to R$_{max}$ during start-up or power-up of array 10, as will be described in more detail presently. Also, bitline 65 is connected to the negative input terminal of operational amplifier 56. Bitline 65 includes a current source 68 at one end and a current sink 69 at the other end. Similarly, digitline 66 includes a current source 70 at one end and a current sink 71 at the other end. All current sources and sinks are enabled by CE and activated by Res. As is understood by those skilled in the art, MTJ memory cell 60 includes a switching transistor 73 connected in series with the MTJ and MTJ memory cell 62 includes a switching transistor 74 connected in series with the MTJ. Both switching transistors 73 and 74 are turned off (non-conducting) when Res goes high.

Figure 4:
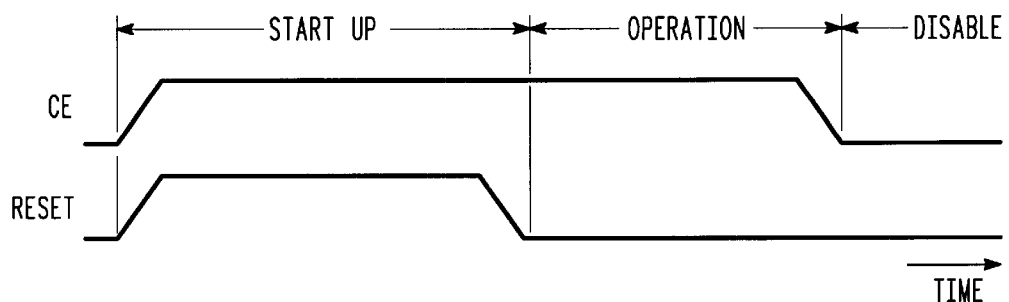
FIG. 4 is a graphical timing representation of input signals supplied to the reference voltage generator of FIG. 3.

Referring additionally to FIG. 4, a graphical timing representation is illustrated of input signals CE and Res as they appear during a normal start-up and operation of array 10. Initially, CE goes high enabling all current sources, current sinks, and operational amplifier 56. At the same time, Res goes high activating all current sources and current sinks, and deactivating operational amplifier 56. Also Res turns off MTJ memory cells 60 and 62 so there is no current path through the cells. However, current flows in bitline 65 and digitline 66 so that MTJ memory cell 62 is programmed from R$_{min}$ to R$_{max}$.

At a later time, Res goes low while CE remains high, which ends the start-up phase of array 10 and begins the operation phase. Under these conditions, the programming of MTJ memory cell 62 ended. Also, operational amplifier 56 is activated and switching transistors 73 and 74 are activated so that current flows in MTJ memory cells 60 and 62. At this time MTJ memory cell 60 provides a resistance equal to R$_{min}$ in the feedback circuit of operational amplifier 56. Also MTJ memory cell 62 provides a resistance equal to R$_{max}$ in the input circuit of operational amplifier 56. With a V$_{bias1}$/2 signal supplied to the positive input terminal of operational amplifier 56, a signal equal to (V$_{bias1}$/2)(1+R$_{min}$/R$_{max}$) is generated at output terminal 58. Thus, a V$_{biasref}$ signal is generated to control Vo$_{ref}$ so that it is always positioned at a midpoint approximately half way between Vo$_{max}$ and Vo$_{min}$.

Thus, a reference voltage generator is disclosed which is simple to manufacture and operate. The V$_{biasref}$ signal which is generated is a function of V$_{bias1}$, R$_{min}$, and, R$_{max}$, which means that V$_{biasref}$ is adjusted based on R$_{min}$, and MR, as well as V$_{bias1}$, which is the clamping voltage applied to the data columns. This relationship greatly simplifies the generation of the reference signal. Further, the reference voltage generator includes MTJ memory cells for generating the R$_{min}$, and, R$_{max}$ signals and by fabricating these MTJ memory cells on the same substrate as the memory array is on, variations due to heat, etc. will generally follow the array components. In the preferred embodiment, the reference voltage generator is set to generate the V$_{biasref}$ signal during the start-up or power-up phase of the associated array because the reference voltage generator can be designed using much simpler circuitry.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. In readout circuitry for a magnetic tunneling junction memory cell, a reference voltage generator comprising an operational amplifier and two MTJ memory cells connected to provide an output signal equal to $(V_{bias1}/2)(1+R_{min}/R_{max})$, where $V_{bias1}$ is a clamping voltage applied to the readout circuitry, $R_{min}$ is a minimum resistance of the magnetic tunneling junction memory cell, and $R_{max}$ is a maximum resistance of the magnetic tunneling junction memory cell.

2. A reference voltage generator as claimed in claim 1 wherein the operational amplifier is a non-inverting operational amplifier.

3. A reference voltage generator as claimed in claim 2 wherein the two MTJ memory cells and the magnetic tunneling junction memory cell being read-out are fabricated on a common substrate.

* * * * *

UNITED STATES PATENT AND TRADEMARK OFFICE
CERTIFICATE OF CORRECTION

PATENT NO.   : 6,385,109 B1
DATED        : May 7, 2002
INVENTOR(S)  : Naji

It is certified that error appears in the above-identified patent and that said Letters Patent is hereby corrected as shown below:

<u>Column 1,</u>
Line 3, after the Title, please add as a new first paragraph the following paragraph:
-- This invention was made with Government support under Agreement No. MDA972-96-3-0016 awarded by DARPA. The Government has certain rights in the invention.--

Signed and Sealed this

Fourth Day of November, 2003

JAMES E. ROGAN
*Director of the United States Patent and Trademark Office*